US009091934B2

(12) United States Patent
Sakai et al.

(10) Patent No.: US 9,091,934 B2
(45) Date of Patent: *Jul. 28, 2015

(54) MASK BLANK, METHOD OF MANUFACTURING THE SAME, TRANSFER MASK, AND METHOD OF MANUFACTURING THE SAME

(75) Inventors: Kazuya Sakai, Shinjuku-ku (JP); Masahiro Hashimoto, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/995,751

(22) PCT Filed: Dec. 22, 2011

(86) PCT No.: PCT/JP2011/079779
§ 371 (c)(1),
(2), (4) Date: Jun. 19, 2013

(87) PCT Pub. No.: WO2012/086744
PCT Pub. Date: Jun. 28, 2012

(65) Prior Publication Data
US 2013/0273738 A1 Oct. 17, 2013

(30) Foreign Application Priority Data

Dec. 24, 2010 (JP) ................................. 2010-287109
Dec. 24, 2010 (JP) ................................. 2010-287110

(51) Int. Cl.
*G03F 1/50* (2012.01)
*H01L 21/3065* (2006.01)
(Continued)

(52) U.S. Cl.
CPC .. *G03F 1/50* (2013.01); *G03F 1/46* (2013.01); *H01L 21/3065* (2013.01); *H01L 21/3081* (2013.01); *G03F 1/82* (2013.01); *H01L 21/3213* (2013.01); *H01L 21/32136* (2013.01)

(58) Field of Classification Search
CPC .................... H01L 21/3065; H01L 21/32136; H01L 21/3213
See application file for complete search history.

(56) References Cited

U.S. PATENT DOCUMENTS

2003/0025216 A1 2/2003 Inazuki et al.
2006/0257755 A1 11/2006 Inazuki et al.
(Continued)

FOREIGN PATENT DOCUMENTS

JP 7-281411 A 10/1995
JP 2003-50453 A 2/2003
(Continued)

OTHER PUBLICATIONS

Translation of Yamada, JP2008116583, May 2008.*

*Primary Examiner* — Duy Deo
(74) *Attorney, Agent, or Firm* — Sughrue Mion, PLLC

(57) ABSTRACT

Provided is a method of manufacturing a mask blank that is improved in cleaning resistance to ozone cleaning or the like, thus capable of preventing degradation of the mask performance due to the cleaning. The method is for manufacturing a mask blank having, on a substrate, a thin film which is formed at its surface with an antireflection layer made of a material containing a transition metal, and carries out a treatment of causing a highly concentrated ozone gas with a concentration of 50 to 100 vol % to act on the antireflection layer to thereby form a surface modified layer comprising a strong oxide film containing an oxide of the transition metal at a surface of the antireflection layer.

16 Claims, 3 Drawing Sheets

(51) Int. Cl.
*G03F 1/46* (2012.01)
*H01L 21/308* (2006.01)
*H01L 21/3213* (2006.01)
*G03F 1/82* (2012.01)

(56) References Cited

U.S. PATENT DOCUMENTS

2010/0316942 A1  12/2010  Igarashi et al.
2011/0244373 A1* 10/2011  Nozawa et al. .................. 430/5

FOREIGN PATENT DOCUMENTS

| JP | 2003-248298 | A | | 9/2003 | |
|----|----|----|----|----|----|
| JP | 2006-317665 | A | | 11/2006 | |
| JP | 2007094250 | | * | 4/2007 | ............... C03F 1/08 |
| JP | 2008-116570 | A | | 5/2008 | |
| JP | 2008-116583 | A | | 5/2008 | |
| JP | 2008116583 | | * | 5/2008 | ............... G03F 1/08 |
| JP | 2010-286665 | A | | 12/2010 | |
| JP | 2011-227461 | A | | 11/2011 | |
| WO | 2009/123167 | A1 | | 10/2009 | |

* cited by examiner

MASK BLANK, METHOD OF MANUFACTURING THE SAME, TRANSFER MASK, AND METHOD OF MANUFACTURING THE SAME

CROSS REFERENCE TO RELATED APPLICATIONS

This application is a National Stage of International Application No. PCT/JP2011/079779 filed Dec. 22, 2011, claiming priority based on Japanese Patent Application Nos. 2010-287109 and 2010-287110 filed Dec. 24, 2010, the contents of all of which are incorporated herein by reference in their entirety.

TECHNICAL FIELD

This invention relates to a mask blank improved in cleaning resistance, to a method of manufacturing the same, to a transfer mask, and to a method of manufacturing the same.

BACKGROUND ART

Generally, fine pattern formation is carried out by the photolithography in manufacturing processes of a semiconductor device. A number of substrates called photomasks (hereinafter referred to as transfer masks) are normally used for this fine pattern formation. The transfer mask comprises generally a transparent glass substrate having thereon a fine pattern made of a metal thin film or the like. The photolithography is used also in the manufacture of the transfer mask.

In the manufacture of a transfer mask by the photolithography, use is made of a mask blank having a thin film (e.g. a light-shielding film or the like) for forming a transfer pattern (mask pattern) on a transparent substrate such as a glass substrate. The manufacture of the transfer mask using the mask blank comprises an exposure process of applying required pattern writing to a resist film formed on the mask blank, a developing process of developing the resist film according to the required pattern writing to form a resist pattern, an etching process of etching the thin film according to the resist pattern, and a process of stripping and removing the remaining resist pattern. In the developing process, a developer is supplied after applying the required pattern writing to the resist film formed on the mask blank to dissolve a portion of the resist film soluble in the developer, thereby forming the resist pattern. In the etching process, using this resist pattern as a mask, an exposed portion of the thin film, where the resist pattern is not formed, is dry-etched or wet-etched, thereby forming a required mask pattern on the transparent substrate. In this manner, the transfer mask is completed.

The transfer mask and the mask blank for manufacturing the transfer mask are cleaned when they are manufactured or used. Conventionally, an acid such as sulfuric acid is generally used for such cleaning (see, e.g. Patent Document 1).

PRIOR ART DOCUMENT

Patent Document

Patent Document 1: JP-A-2003-248298

SUMMARY OF THE INVENTION

Problem to be Solved by the Invention

However, if the cleaning is carried out using the acid such as sulfuric acid when the transfer mask is manufactured or used, the sulfuric acid or sulfate ions remaining after the cleaning reacts with high-energy exposure light to be precipitated as ammonium sulfide and this causes a cloud (called a haze) on the transfer mask. In recent years, the wavelength of an exposure light source in the manufacture of a semiconductor device has been shortened from KrF excimer laser (wavelength 248 nm) to ArF excimer laser (wavelength 193 nm). With an increase in the energy of the exposure light, the problem of the generation of a haze due to cleaning using an acid such as sulfuric acid has been becoming significant.

In view of this, in order to prevent the generation of such a haze due to cleaning using an acid, ozone cleaning with ozone water or UV ozone has recently been used for a mask blank and a transfer mask particularly comprising a chromium-based thin film.

However, according to a study by the present inventors, it has been found that a problem arises that such ozone cleaning dissolves a thin film made of a material containing a transition metal to cause a film loss, resulting in a change in optical properties (reduction in optical density, change in reflectance, etc.). In particular, it has been found that the above-mentioned problem is significant when the transition metal is chromium. Since the transfer mask manufacturing cost has been increasing following the pattern miniaturization in recent years, it has been attempted to prolong the lifetime of a transfer mask, which, however, results in increasing the number of times of cleaning correspondingly. Consequently, it has also been found that, particularly in a phase shift mask having a chromium-based light-shielding film pattern on a light-semitransmissive film pattern, a problem of a change in the optical properties of the light-shielding film pattern is significant due to an increase in the number of times of ozone cleaning.

In the transfer mask, such a change in optical properties is a serious problem that affects the mask performance, finally leading to degradation of the quality of a semiconductor device which is manufactured using the transfer mask.

Therefore, this invention has been made in order to solve the conventional problems and has an object to provide a mask blank that is improved in cleaning resistance to ozone cleaning or the like, thus capable of preventing degradation of the mask blank performance and the mask performance due to the cleaning, a method of manufacturing such a mask blank, a transfer mask, and a method of manufacturing such a transfer mask.

Means for Solving the Problem

As a result of intensive studies for solving the above-mentioned problems, the present inventors have found that, in a method of manufacturing a mask blank having, on a substrate, a thin film which is formed at its surface with an antireflection layer made of a material containing a transition metal, if a highly concentrated ozone gas with a concentration of 50 to 100 vol % is caused to act on the antireflection layer to thereby form a strong oxide film containing a metal oxide with a high degree of oxidation at a surface of the antireflection layer, the cleaning resistance to ozone cleaning or the like can be improved without changing (degrading) the flatness of the mask blank, the surface roughness of the thin film, the optical properties of the thin film, the in-plane uniformity of the optical properties of the thin film, or the like.

The present inventors have completed this invention as a result of further continuing intensive studies based on the elucidated fact described above.

Specifically, in order to solve the above-mentioned problems, this invention has the following structures.

(Structure 1)

A method of manufacturing a mask blank having, on a substrate, a thin film which is formed at its surface with an antireflection layer made of a material containing a transition metal, comprising:

carrying out a treatment of causing a highly concentrated ozone gas with a concentration of 50 to 100 vol % to act on the antireflection layer to thereby form a surface modified layer comprising a strong oxide film containing an oxide of the transition metal at a surface of the antireflection layer.

(Structure 2)

The method of manufacturing a mask blank according to structure 1, wherein the treatment causes the highly concentrated ozone gas and an unsaturated hydrocarbon gas to act on the antireflection layer.

(Structure 3)

The method of manufacturing a mask blank according to structure 2, wherein the unsaturated hydrocarbon is a low-grade unsaturated hydrocarbon having a carbon number of 1 to 4.

(Structure 4)

The method of manufacturing a mask blank according to any one of structures 1 to 3, wherein the treatment is carried out while heating the substrate with the thin film at 80° C. or less.

(Structure 5)

The method of manufacturing a mask blank according to any one of structures 1 to 4, wherein a property of the mask blank is maintained before and after the treatment and the property is at least one of a flatness of the mask blank, a surface roughness of the thin film, an optical property of the thin film, and an in-plane uniformity of the optical property of the thin film.

(Structure 6)

The method of manufacturing a mask blank according to any one of structures 1 to 5, wherein an amount of change in flatness of the mask blank is 30 nm or less before and after the treatment.

(Structure 7)

The method of manufacturing a mask blank according to any one of structures 1 to 6, wherein the surface modified layer has a surface roughness (Ra) of 0.70 nm or less.

(Structure 8)

The method of manufacturing a mask blank according to any one of structures 1 to 7, wherein the transition metal is chromium (Cr) or tantalum (Ta).

(Structure 9)

A mask blank manufactured by the method of manufacturing a mask blank according to any one of structures 1 to 8.

(Structure 10)

A mask blank, comprising:

a substrate;

a thin film formed on the substrate; and an antireflection layer formed on a surface of the thin film and made of a material containing a transition metal;

wherein the antireflection layer has a surface modified layer comprising a strong oxide film containing an oxide of the transition metal.

(Structure 11)

The mask blank according to structure 10, wherein the surface modified layer has a surface roughness (Ra) of 0.70 nm or less.

(Structure 12)

The mask blank according to any one of structures 9 to 11, wherein the transition metal is chromium (Cr) and the oxide of the surface modified layer contains a trivalent or tetravalent chromium oxide.

(Structure 13)

The mask blank according to any one of structures 9 to 12, wherein the transition metal is chromium (Cr) and the surface modified layer is such that when an O (oxygen) 1 s spectrum measured by X-ray photoelectron spectroscopy (XPS) is separated into a first peak at a binding energy of about 532 eV and a second peak at a binding energy of substantially 530 eV, a ratio of a first peak area to a second peak area is 2.0 or more.

(Structure 14)

The mask blank according to any one of structures 9 to 13, wherein the surface modified layer has a thickness of 3 nm or less.

(Structure 15)

A transfer mask obtained by patterning the thin film in the mask blank according to any one of structures 9 to 14 to form a thin film pattern.

(Structure 16)

A method of manufacturing a transfer mask having, on a substrate, a thin film pattern formed by patterning a thin film comprising a material containing a transition metal, comprising:

carrying out a treatment of causing a highly concentrated ozone gas with a concentration of 50 to 100 vol % to act on the thin film pattern to thereby form a surface modified layer comprising a strong oxide film containing an oxide of the transition metal in a surface layer of the thin film pattern.

(Structure 17)

The method of manufacturing a transfer mask according to structure 16, wherein the treatment causes the highly concentrated ozone gas and an unsaturated hydrocarbon gas to act on the thin film pattern.

(Structure 18)

The method of manufacturing a transfer mask according to structure 17, wherein the unsaturated hydrocarbon is a low-grade unsaturated hydrocarbon having a carbon number of 1 to 4.

(Structure 19)

The method of manufacturing a transfer mask according to any one of structures 16 to 18, wherein the treatment is carried out while heating the substrate with the thin film pattern at 80° C. or less.

(Structure 20)

The method of manufacturing a transfer mask according to any one of structures 16 to 19, wherein a property of the transfer mask is maintained before and after the treatment and the property includes any one of an optical density, a surface reflectance at an exposure wavelength, a surface reflectance at an inspection wavelength, and a CD of the thin film pattern.

(Structure 21)

The method of manufacturing a transfer mask according to any one of structures 16 to 20, wherein the surface modified layer has a thickness of 3 nm or less.

(Structure 22)

The method of manufacturing a transfer mask according to any one of structures 16 to 21, wherein the transition metal is chromium (Cr) and the oxide of the surface modified layer contains a trivalent or tetravalent chromium oxide.

(Structure 23)

The method of manufacturing a transfer mask according to any one of structures 16 to 21, wherein the transition metal is tantalum (Ta).

(Structure 24)

A transfer mask manufactured by the method of manufacturing a transfer mask according to any one of structures 16 to 23.

(Structure 25)

A method of manufacturing a semiconductor device, comprising forming a circuit pattern on a semiconductor wafer using the transfer mask according to structure 15 or 24.

Effect of the Invention

According to a method of manufacturing a mask blank of this invention, after forming, on a substrate, a thin film which is formed at its surface with an antireflection layer made of a material containing a transition metal, if a highly concentrated ozone gas with a concentration of 50 to 100 vol % is caused to act on the thin film to thereby form a surface modified layer comprising a strong oxide film containing an oxide of the transition metal at a surface of the antireflection layer, the cleaning resistance to ozone cleaning or the like can be improved without degrading the flatness of the mask blank, the surface roughness of the thin film, the optical properties of the thin film, the in-plane uniformity of the optical properties of the thin film, or the like.

Further, in a transfer mask which is manufactured using the mask blank of this invention, it is possible to improve the cleaning resistance to ozone cleaning or the like when it is used, and thus to prevent degradation of the mask performance due to the cleaning.

According to a method of manufacturing a transfer mask of this invention, after forming a thin film pattern by patterning a thin film formed on a substrate and comprising a material containing a transition metal, if a highly concentrated ozone gas with a concentration of 50 to 100 vol % is caused to act on the thin film pattern to thereby form a surface modified layer comprising a strong oxide film containing an oxide of the transition metal at a surface of the thin film pattern, the cleaning resistance to ozone cleaning or the like can be improved without degrading the optical density, the optical properties, the CD, their in-plane uniformity, or the like of the thin film pattern.

Further, in the transfer mask which is manufactured by the method of manufacturing the transfer mask of this invention, it is possible to improve the cleaning resistance to ozone cleaning or the like when it is used, and thus to prevent degradation of the mask performance due to the cleaning.

MODE FOR CARRYING OUT THE INVENTION

Hereinbelow, an embodiment 1 of this invention will be described in detail.

As the invention of Structure 1, this invention is a method of manufacturing a mask blank having, on a substrate, a thin film which is formed at its surface with an antireflection layer made of a material containing a transition metal, and comprises carrying out a treatment of causing a highly concentrated ozone gas with a concentration of 50 to 100 vol % to act on the antireflection layer to thereby form a surface modified layer comprising a strong oxide film containing an oxide of the transition metal at a surface of the antireflection layer.

Figures 1, 2:
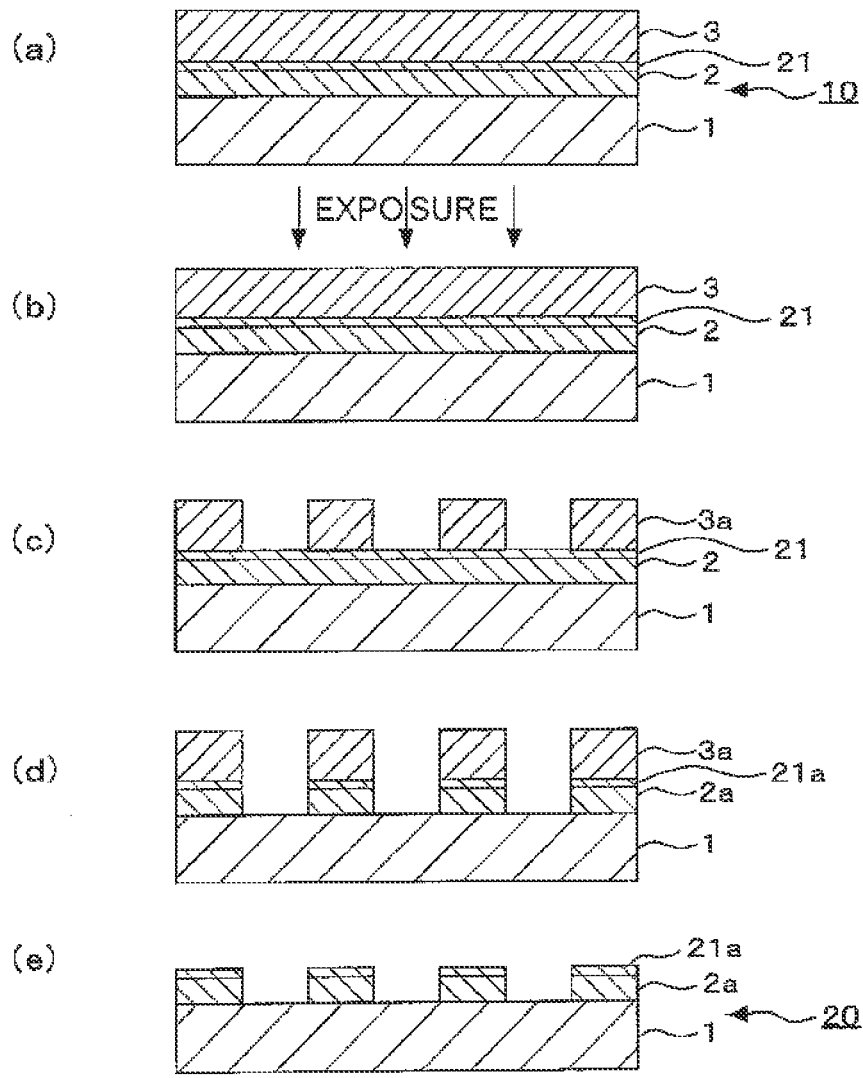
FIG. 1 is a cross-sectional view of a mask blank.
FIG. 2 is cross-sectional views showing processes of manufacturing a transfer mask using the mask blank.

FIG. 1 is a cross-sectional view showing an embodiment of a mask blank of this invention. According to this, a mask blank 10 of this embodiment is configured to have, on a transparent substrate 1, a thin film 2 which is for forming a thin film pattern (transfer pattern) and is formed at its surface with an antireflection layer 21 made of a material containing a transition metal.

The transparent substrate 1 is not particularly limited as long as it has transparency at an exposure wavelength to be used. In this invention, a quartz substrate and various other glass substrates (e.g. soda-lime glass, aluminosilicate glass, etc.) can be used. Among them, the quartz substrate is particularly suitable for this invention because it has high transparency in the range of ArF excimer laser to shorter wavelengths.

The thin film 2 for forming the transfer pattern is a thin film comprising a material containing a transition metal and having, at least as its uppermost layer (outermost surface layer), the antireflection layer 21 made of the material containing the transition metal. While details will be described later, there can be cited, for example, a front-surface antireflection layer in a light-shielding film comprising a material containing a transition metal alone, such as chromium, tantalum, or tungsten, or containing its compound, an etching mask film provided on a light-shielding film or the like and having an antireflection function, or the like.

A sputtering film forming method, for example, is preferably cited as a method of forming the thin film 2 on the transparent substrate 1, but this invention is not necessarily limited to the sputtering film forming method.

While the mask blank 10 shown in FIG. 1 has no resist film on the thin film 2, this invention includes a mask blank of a structure having an arbitrary resist film on the thin film 2.

For the purpose of forming a surface modified layer comprising a strong oxide film containing an oxide of the transition metal at a surface (surface layer portion) of the antireflection layer 21, a manufacturing method of the mask blank 10 of this invention causes a 50 to 100 vol % highly concentrated ozone gas to act on the surface of the antireflection layer 21. Incidentally, there is conventionally known a method of heating a mask blank in the atmosphere or in an atmosphere with an oxygen content higher than that of the atmosphere to form an oxide film at a surface of a thin film, thereby improving chemical resistance and so on. However, according to a study by the present inventors, it is difficult, by such a heat treatment, to form a strong oxide film containing an oxide of a transition metal while maintaining the properties of the mask blank.

For example, in order to improve the cleaning resistance to ozone cleaning, which is the object of this invention, by a heat treatment, when the transition metal is chromium, the heat treatment should be carried out at a high temperature for a long time such as, at least, at a temperature of 300° C. for several hours or more. Therefore, even if the cleaning resistance is improved to a certain degree, if such a high-temperature long-time heat treatment is carried out, the occurrence of degradation of the thin film, change in the flatness of the mask blank, degradation in surface roughness, change in optical properties, change in the in-plane uniformity of the optical properties, or the like cannot be avoided, leading to a possibility of causing degradation of the mask blank performance and thus the mask performance.

On the other hand, according to the above-mentioned treatment of causing the highly concentrated ozone gas to act, the surface modified layer can be formed at a low temperature in a short time and thus, while the properties of the mask blank are maintained, i.e. without degrading at all the flatness of the mask blank, the surface roughness of the thin film, the optical properties of the thin film, or the like, the surface modified layer in the form of the strong oxide film can be formed at the surface of the antireflection layer of the thin film. Further, the oxidation reaction rate gradually decreases as the treatment time of the highly concentrated ozone gas treatment increases so that even if the treatment is carried out for a certain time (about 30 minutes) or more, the oxidation reaction does not proceed and thus the thickness of the strong oxide film does not increase. Accordingly, the highly concentrated ozone gas treatment is excellent particularly in the controllability of the in-plane uniformity of the optical properties of the thin film.

According to a study by the present inventors, it is considered that, by carrying out the treatment of causing the highly concentrated ozone gas to act on (supplying it to) the surface of the antireflection layer in the thin film as described above, the surface of the antireflection layer containing oxygen is modified so that the strong oxide film is formed.

As a method of causing the highly concentrated ozone gas to act on the surface of the antireflection layer, there can be cited, for example, a method in which the mask blank is placed in a proper chamber and then the highly concentrated ozone gas is introduced into the chamber to replace the inside of the chamber with the highly concentrated ozone gas. Alternatively, it may be a method that supplies the highly concentrated ozone gas by, for example, spraying the gas directly on the surface of the antireflection layer.

When causing the highly concentrated ozone gas to act, it is preferable to mix together the highly concentrated ozone gas and an unsaturated hydrocarbon gas near the surface of the antireflection layer and supply them to the surface of the antireflection layer. If a hydrocarbon (alkene) having a double bond of carbon, such as ethylene, a hydrocarbon (alkyne) having a triple bond of carbon, such as acetylene, or a low molecular weight hydrocarbon such as butylene is used as the unsaturated hydrocarbon gas, an unstable intermediate such as ozonide is formed and, in the course of decomposition of this unstable intermediate, the reaction for forming the strong oxide film is further promoted, which is thus preferable.

As the unsaturated hydrocarbon, there can be cited, for example, a hydrocarbon (alkene) having a double bond of carbon, such as ethylene or butylene, a hydrocarbon (alkyne) having a triple bond of carbon, such as acetylene, or the like. Particularly, such a low-grade unsaturated hydrocarbon having a carbon number of about 1 to 4 is preferable.

When the treatment is carried out using the highly concentrated ozone gas and the unsaturated hydrocarbon gas, the strong oxide film can be formed while the treatment time is set shorter and the substrate heating temperature, which will be described later, is set lower compared to the treatment using only the highly concentrated ozone gas. Consequently, the strong oxide film can be formed as a uniform coating film without degrading the mask blank performance.

The supply ratio (flow rate ratio) of the highly concentrated zone gas to the unsaturated hydrocarbon gas is preferably 1:1 to 4:1. If it is in this range, the reaction between the highly concentrated zone gas and the unsaturated hydrocarbon gas is satisfactorily carried out.

The ozone concentration is in a range of 50 to 100 vol %. If the ozone concentration is less than 50 vol %, there is a possibility that the treatment time is required to be very long or that even if the treatment time is prolonged, the thickness required for improving the cleaning resistance cannot be ensured. The ozone concentration is preferably 100 vol % because the strong oxide film can be formed in a short treatment time at a low substrate heating temperature.

The treatment time (time for causing the highly concentrated ozone gas to act) may be properly determined taking into account the ozone concentration, the substrate heating temperature, the thickness of the surface modified layer, the coverage, and so on.

This highly concentrated ozone gas treatment can be carried out at room temperature. On the other hand, in order to further promote the reaction in which the strong oxide film is formed at the surface of the antireflection layer in the thin film, the substrate may be heated to about 50 to 80° C., for example. In this case, if the heating temperature is too high, although depending on the material of the thin film, in the case of, for example, a film of a chromium-based material, there is a possibility that the film is degraded if the heating temperature exceeds 100° C.

In the manufacturing method of the mask blank 10 of this invention, the properties of the mask blank can be maintained before and after the treatment (before and after the formation of the surface modified layer). Such properties include at least one of an amount of change in the flatness of the mask blank, a surface roughness of the thin film, optical properties of the thin film, and in-plane uniformity of the optical properties of the thin film. The optical properties of the thin film include an optical density (OD), a front-surface reflectance for exposure light, a front-surface reflectance for inspection light, a transmittance, a phase difference, and so on. The thin film is adjusted so that the optical density is 2.5 to 3.1, that the front-surface reflectance for exposure light is 40% or less (preferably 30% or less), and that the contrast can be sufficiently ensured for inspection light (e.g. 193 nm, 257 nm, 364 nm, 488 nm, etc.) which is used for defect inspection or the like of a mask blank or a transfer mask. In the case of a halftone phase shift mask blank, the thin film is adjusted so that the transmittance is 1 to 30% and that the phase difference is 160° to 200°. In this invention, even if the treatment of forming the surface modified layer is applied to the thin film in which the above-mentioned properties of the mask blank are adjusted, the strong oxide film can be formed in the state where the properties of the mask blank before the treatment are maintained without changing (degrading) the adjusted properties of the mask blank.

In the manufacturing method of the mask blank 10 of this invention, the amount of change in flatness (absolute value) is 30 nm or less before and after the treatment. Preferably, the amount of change in flatness (absolute value) is 10 nm or less before and after the treatment.

The flatness described in this invention is a value representing a warp (deformation amount) of a surface given by TIR (Total Indicated Reading). In this invention, the flatness is given by a measurement value in a 142×142 mm area. For example, it is a measurement value in a 142×142 mm area at the center of a 6-inch substrate.

In the manufacturing method of the mask blank 10 of this invention, the surface roughness (Ra) of the surface modified layer of the antireflection layer in the thin film is 0.70 nm or less. In this invention, since it is possible to prevent degradation of the surface roughness due to the formation of the surface modified layer in the surface layer of the antireflection layer, the surface roughness of the surface of the antireflection layer, i.e. the surface roughness of the surface of the surface modified layer, can be suppressed to Ra=0.70 nm or less and further to Ra=0.50 nm or less.

By suppressing the surface roughness to Ra=0.70 nm or less and further to Ra=0.50 nm or less, LER (Line Edge Roughness) of a thin film pattern can be made small and further the cross-sectional shape of the thin film pattern can also be made excellent, which is thus preferable. In the case where the surface modified layer is formed in the thin film by the highly concentrated ozone gas treatment of this invention, the surface roughness does not change or hardly changes before and after the formation of the surface modified layer.

In this invention, the unit Ra representing the surface roughness can be measured by an atomic force microscope (AFM). While specific measurement is carried out in a region of, for example, 1 μm square, it is preferable to have a uniform surface roughness in an effective area of a mask. Herein, in the case of a 6-inch substrate, a region of, for example, about 142 mm square may be considered as an effective area of a mask.

As described above, according to the mask blank manufacturing method of this invention, since the flatness of the mask blank, the surface roughness of the thin film, the optical properties of the thin film, the in-plane uniformity of the optical properties of the thin film, or the like is not degraded, no influence is exerted on the mask blank performance or the transfer mask performance. Further, when manufacturing a transfer mask by patterning the thin film formed with the surface modified layer, since the etching characteristics of the thin film are not degraded, the processing accuracy of the transfer mask is also not reduced.

Further, it is also suitable for transfer masks which use the double patterning/double exposure techniques. Since these exposure techniques use a set of two transfer masks, the requirement for the accuracy of the two transfer masks is strict. This invention can satisfy such a requirement.

The mask blank 10 of this invention has the surface modified layer in the form of the strong oxide film containing the oxide of the transition metal at the surface (surface layer portion) of the antireflection layer 21 in the thin film 2. This surface modified layer is the strong oxide film containing the oxide of the transition metal and this strong oxide film contains the metal oxide with a particularly high degree of oxidation, and therefore, it is possible to significantly improve the cleaning resistance to ozone cleaning or the like. Herein, the degree of oxidation of a metal oxide is the constituent number of oxygen atoms per transition metal. In this invention, "high degree of oxidation" represents that the degree of oxidation defined as described above is 1.5 or 2. For example, when the transition metal is chromium, a trivalent or tetravalent chromium oxide ($Cr_2O_3$, $CrO_2$) or the like is classified as a metal oxide with a high degree of oxidation.

Figure 3:
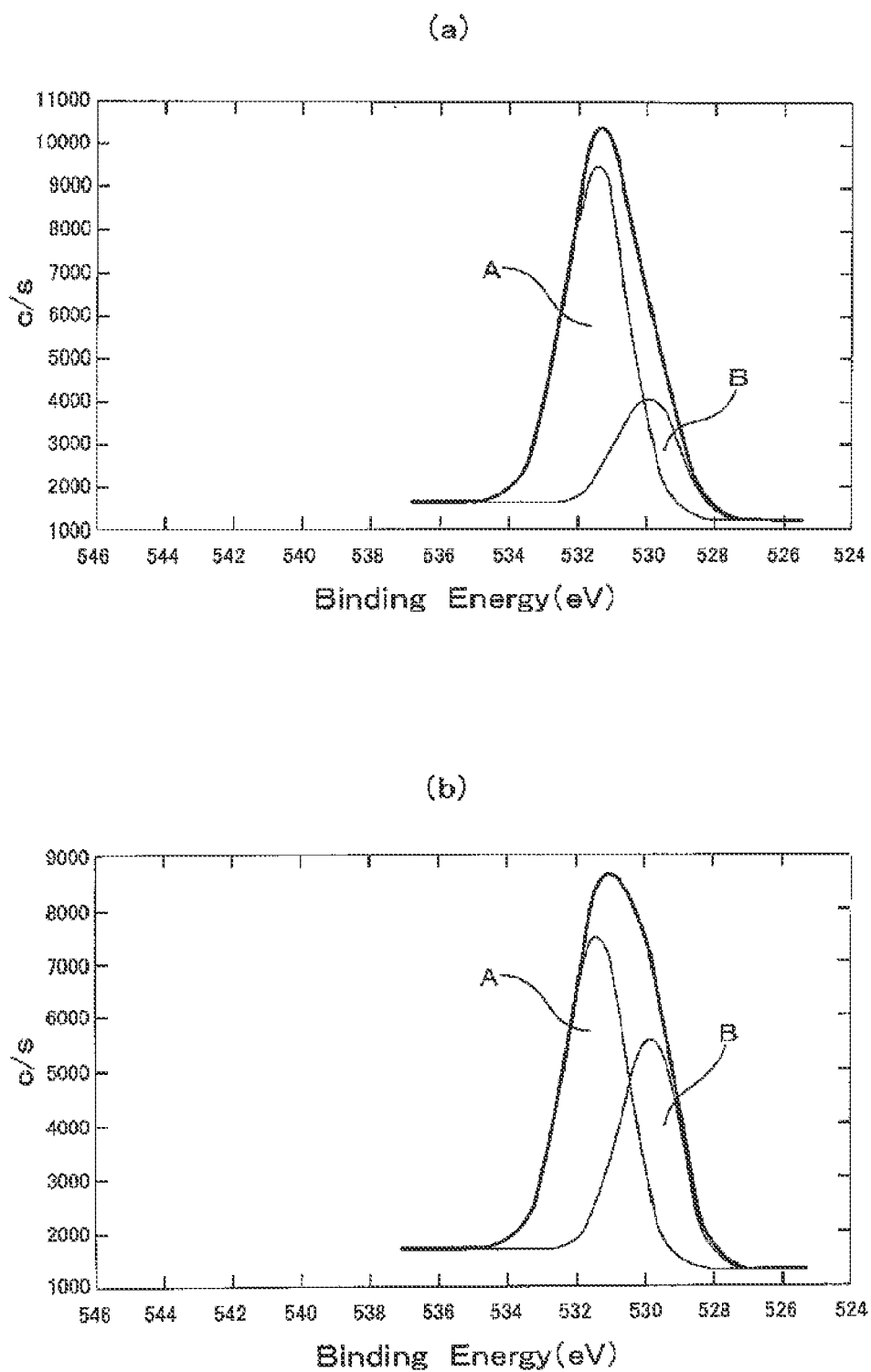
FIG. 3 shows the results of analysis by X-ray photoelectron spectroscopy of a surface modified layer in Example 1, wherein (a) is O1 s spectra of the surface modified layer and (b) is O1 s spectra of a surface layer portion of a light-shielding film before applying a highly concentrated ozone gas treatment.

FIG. 3 shows the results of analysis by X-ray photoelectron spectroscopy (XPS) of a surface modified layer in later-described Example 1, wherein (a) is O (oxygen) 1 s spectra of the surface modified layer and (b) is O1 s spectra of a surface layer portion of a light-shielding film in the state where the surface modified layer by the above-mentioned highly concentrated ozone gas treatment is not formed. While details will be described later in Example 1, Example 1 relates to a phase shift mask blank in which a light-semitransmissive film made of a MoSi-based material and a light-shielding film made of a Cr-based material are laminated in this order on a transparent substrate and a surface modified layer is formed at a surface of the light-shielding film by a highly concentrated ozone gas treatment.

The surface modified layer is such that when an O1 s spectrum measured by XPS is separated into a first peak at a binding energy of about 532 eV and a second peak at a binding energy of about 530 eV, the ratio of the first peak area to the second peak area is 2.0 or more. The first peak is formed mainly by a chromium oxide component with a high degree of oxidation ($Cr_2O_3$ or the like) and an organic-based oxygen component (these are defined as components A). The second peak is formed mainly by a chromium oxide component with a low degree of oxidation (CrO or the like) and a chromium oxynitride component (these are defined as components B). The oxide component with a degree of oxidation of 1.5 or 2 appears at the first peak while the oxide component with a degree of oxidation of less than 1.5 appears at the second peak. In this invention, "high degree of oxidation" includes a case where the first peak intensity of the O1 s spectra is 9000 c/s or more, preferably 10000 c/s or more.

From these analysis results, the components A are 74% while the components B are 26% and, due to the formation of the surface modified layer by the highly concentrated ozone gas treatment at a surface of an antireflection layer in the thin film for pattern formation, the ratio of the components A is increased (the ratio of the components B is reduced) compared to the state, before applying the highly concentrated ozone gas treatment, where the surface modified layer is not formed (spectra of (b) described above). This is considered to be because Cr—N bonds such as CrN or CrON are replaced by Cr—O bonds by the highly concentrated ozone gas treatment so that $Cr_2O_3$ or $CrO_2$ increases, resulting in the increase of the ratio of the components A. It is considered that the cleaning resistance is improved by, as described above, causing the surface of the antireflection layer in the thin film to be the strong oxide film (surface modified layer) containing the metal oxide with a high degree of oxidation.

In the case where the highly concentrated ozone gas treatment is not carried out, there is a possibility that the surface layer of the thin film is naturally oxidized so that an oxide film containing components A is formed. However, a surface modified layer of this invention in the form of a uniform strong oxide film capable of improving the cleaning resistance is not formed.

In this invention, the thickness of the surface modified layer is not particularly limited. However, in order to improve the cleaning resistance of a transfer mask which is manufactured using the mask blank of this invention, it is preferably at least 1 nm or more taking into account a film loss in an etching process when manufacturing the mask. On the other hand, in order to maintain the properties of the mask blank, particularly the in-plane uniformity of the optical properties, the thickness is preferably set to 3 nm or less.

The presence of the surface modified layer can be confirmed by, for example, cross-sectional TEM observation of the thin film and the thickness of the surface modified layer can also be specified.

This invention also provides a transfer mask which is manufactured using the above-mentioned mask blank, i.e. a transfer mask which is obtained by patterning the thin film in the mask blank of this invention to form a transfer pattern. Using the mask blank of this invention, it is possible to improve the cleaning resistance of the manufactured transfer mask.

FIG. 2 is cross-sectional views showing processes of manufacturing a transfer mask using the mask blank of this invention.

Using the mask blank 10 in which the thin film 2 including the antireflection layer 21 is formed on the transparent substrate 1 and the surface modified layer is formed in the surface layer of the antireflection layer 21, a thin film pattern is formed by patterning the thin film of the mask blank using the photolithography. Specifically, a positive resist film 3 for electron beam writing, for example, is formed on the mask blank (see the same figure, (a)) and then a required device pattern is written thereon (see the same figure, (b)). After the writing, the resist film 3 is developed, thereby forming a resist pattern 3a (see the same figure, (c)). Then, the thin film 2 including the antireflection layer 21 is etched using the resist pattern 3a as a mask, thereby forming a thin film pattern 2a including an antireflection layer pattern 21a (see the same figure, (d)). As an etching method in this event, dry etching which is effective for forming a fine pattern can be preferably used.

The remaining resist pattern is removed, thereby obtaining a transfer mask 20 in which the thin film pattern 2a including the antireflection layer pattern 21a is formed on the transparent substrate 1 (see the same figure, (e)).

Hereinbelow, an embodiment 2 of this invention will be described in detail.

As the invention of Structure 16, this invention is a method of manufacturing a transfer mask having, on a substrate, a thin film pattern formed by patterning a thin film comprising a material containing a transition metal, and comprises carrying out a treatment of causing a highly concentrated ozone gas with a concentration of 50 to 100 vol % to act on the thin film pattern to thereby form a surface modified layer comprising a strong oxide film containing an oxide of the transition metal in a surface layer of the thin film pattern.

Figure 4:
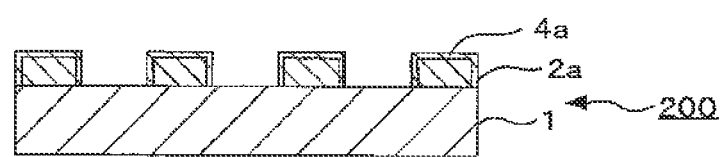
FIG. 4 is a cross-sectional view of a transfer mask.

FIG. 4 is a cross-sectional view showing an embodiment of a transfer mask 200 of this invention. According to this, the transfer mask 200 of this embodiment is configured to have, on a transparent substrate 1, a thin film pattern (transfer pattern) 2a formed by patterning a thin film comprising a material containing a transition metal. The same numerals are assigned to the same members as those in the above-mentioned embodiment 1.

The thin film pattern 2a is a thin film pattern comprising a material containing a transition metal and may be in the form of a single layer or laminated layers. In the case of the laminated layers, at least the uppermost layer (outermost surface layer) is made of the material containing the transition metal. While details will be described later, there can be cited, for example, a light-shielding film comprising a material containing a transition metal alone, such as chromium, tantalum, or tungsten, or containing its compound, an etching mask film provided on a light-shielding film or the like, or the like. The thin film pattern 2a may include an antireflection layer.

While the transfer mask 200 shown in FIG. 4 has no pellicle, this invention includes a transfer mask of a structure having a pellicle.

A manufacturing method of the transfer mask 200 of this invention manufactures the transparent substrate 1 formed with the thin film pattern 2a in the same manner as the manufacturing method of the transfer mask 20 shown in FIG. 2.

For the purpose of forming a surface modified layer 4a comprising a strong oxide film containing an oxide of the transition metal at a surface (surface layer portion and side walls) of the thin film pattern 2a, the manufacturing method of the transfer mask 200 of this invention causes a 50 to 100 vol % highly concentrated ozone gas to act on the surface of the thin film pattern 2a. Incidentally, there is conventionally known a method of heating a transfer mask in the atmosphere or in an atmosphere with an oxygen content higher than that of the atmosphere to form an oxide film at a surface of a thin film, thereby improving chemical resistance and so on. However, according to a study by the present inventors, it is difficult, by such a heat treatment, to form a strong oxide film containing an oxide of a transition metal while maintaining the properties of the transfer mask. For example, in order to improve the cleaning resistance to ozone cleaning, which is the object of this invention, when the transition metal is chromium, the heat treatment should be carried out at a high temperature for a long time such as, at least, at a temperature of 300° C. for several hours or more. Therefore, even if the cleaning resistance is improved to a certain degree, if such a high-temperature long-time heat treatment is carried out, the occurrence of degradation of the thin film pattern, change in the optical properties, such as the optical density and the front-surface reflectance, of the thin film pattern, change in the CD of the thin film pattern, change in their in-plane uniformity of the thin film pattern, or the like cannot be avoided, leading to a possibility of causing degradation of the mask performance.

On the other hand, according to the above-mentioned treatment of causing the highly concentrated ozone gas to act, the surface modified layer can be formed at a low temperature in a short time and thus, while the properties of the transfer mask are maintained, i.e. without degrading at all the optical properties, the CD, or the like of the thin film pattern, the surface modified layer in the form of the strong oxide film can be formed at the surface of the thin film pattern. Further, the oxidation reaction rate gradually decreases as the treatment time of the highly concentrated ozone gas treatment increases so that even if the treatment is carried out for a certain time (about 30 minutes) or more, the oxidation reaction does not proceed and thus the thickness of the strong oxide film does not increase. Accordingly, the highly concentrated ozone gas treatment is excellent particularly in the controllability of the in-plane uniformity of the optical properties and the CD of the thin film pattern.

According to a study by the present inventors, it is considered that, by carrying out the treatment of causing the highly concentrated ozone gas to act on (supplying it to) the surface of the thin film pattern as described above, the surface (including the side surfaces) of the thin film pattern is modified so that the strong oxide film is formed.

As a method of causing the highly concentrated ozone gas to act on the surface of the thin film pattern, there can be cited, for example, a method in which the transfer mask is placed in a proper chamber and then the highly concentrated ozone gas is introduced into the chamber to replace the inside of the chamber with the highly concentrated ozone gas. Alternatively, it may be a method that supplies the highly concentrated ozone gas by, for example, spraying the gas directly on the surface of the thin film pattern. When the highly concentrated ozone gas treatment is applied to the thin film pattern in a completely gaseous state, even if the pattern size is very small, the gas enters between patterns so that the uniform surface modified layer can be formed not only at the surface of the thin film pattern but also at the side walls of the thin film pattern. On the other hand, when an attempt is made to form a surface modified layer by, for example, a plasma treatment containing steam, oxygen, and so on, the steam or the like cannot sufficiently enter between patterns, resulting in difficulty of uniform formation of a surface modified layer at pattern side walls. Presumably, this becomes more significant as the pattern size decreases.

When causing the highly concentrated ozone gas to act, it is preferable to mix together the highly concentrated ozone gas and an unsaturated hydrocarbon gas near the surface of the thin film pattern and supply them to the surface of the thin film pattern. If a hydrocarbon (alkene) having a double bond of carbon, such as ethylene, a hydrocarbon (alkyne) having a triple bond of carbon, such as acetylene, or a low molecular weight hydrocarbon such as butylene is used as the unsaturated hydrocarbon gas, an unstable intermediate such as ozonide is formed and, in the course of decomposition of this unstable intermediate, the reaction for forming the strong oxide film is further promoted, which is thus preferable.

As the unsaturated hydrocarbon, there can be cited, for example, a hydrocarbon (alkene) having a double bond of carbon, such as ethylene or butylene, a hydrocarbon (alkyne) having a triple bond of carbon, such as acetylene, or the like. Particularly, such a low-grade unsaturated hydrocarbon having a carbon number of about 1 to 4 is preferable.

When the treatment is carried out using the highly concentrated ozone gas and the unsaturated hydrocarbon gas, the strong oxide film can be formed while the treatment time is set shorter and the substrate heating temperature, which will be described later, is set lower compared to the treatment using only the highly concentrated ozone gas. Consequently, the strong oxide film can be formed as a uniform coating film without degrading the transfer mask performance.

The supply ratio (flow rate ratio) of the highly concentrated zone gas to the unsaturated hydrocarbon gas is preferably 1:1 to 4:1. If it is in this range, the reaction between the highly concentrated zone gas and the unsaturated hydrocarbon gas is satisfactorily carried out.

The ozone concentration is in a range of 50 to 100 vol %. If the ozone concentration is less than 50 vol %, there is a possibility that the treatment time is required to be very long or that even if the treatment time is prolonged, the thickness required for improving the cleaning resistance cannot be ensured. The ozone concentration is preferably 100 vol % because the strong oxide film can be formed in a short treatment time at a low substrate heating temperature.

The treatment time (time for causing the highly concentrated ozone gas to act) may be properly determined taking into account the ozone concentration, the substrate heating temperature, the thickness of the surface modified layer, the coverage, and so on.

This highly concentrated ozone gas treatment can be carried out at room temperature. On the other hand, in order to further promote the reaction in which the strong oxide film is formed at the surface of the thin film pattern, the substrate may be heated to about 50 to 80° C., for example. In this case, if the heating temperature is too high, although depending on the material of the thin film pattern, in the case of, for example, a film of a chromium-based material, there is a possibility that the film is degraded if the heating temperature exceeds 100° C.

In the manufacturing method of the transfer mask 200 of this invention, the properties of the transfer mask can be maintained before and after the treatment (before and after the formation of the surface modified layer). Such properties include at least one of optical properties of the thin film pattern, a CD of the thin film pattern, and in-plane uniformity of the optical properties or the CD. The optical properties of the thin film pattern include an optical density (OD), a front-surface reflectance for exposure light, a front-surface reflectance for inspection light, a transmittance, a phase difference, and so on. The thin film pattern is adjusted so that the optical density is 2.5 to 3.1, that the front-surface reflectance for exposure light is 40% or less (preferably 30% or less), and that the contrast can be sufficiently ensured for inspection light (e.g. 193 nm, 257 nm, 364 nm, 488 nm, etc.) which is used for defect inspection or the like of a mask blank or a transfer mask. In the case of a halftone phase shift mask, the thin film pattern is adjusted so that the transmittance is 1 to 30% and that the phase difference is 160° to 200°. In this invention, even if the treatment of forming the surface modified layer 4a is applied to the thin film pattern in which the above-mentioned properties of the transfer mask are adjusted, the strong oxide film can be formed in the state where the properties of the transfer mask before the treatment are maintained without changing (degrading) the adjusted properties of the transfer mask.

In the manufacturing method of the transfer mask 200 of this invention, the CD variation of the thin film pattern is 5 nm or less. In the DRAM half-pitch (hp) 32 nm generation according to the semiconductor device design rule, it is necessary to set the CD variation to 2.6 nm or less on a wafer. For this purpose, the CD variation required for a transfer mask for use in the hp 32 nm generation is preferably suppressed to 5 nm or less. In the manufacturing method of the transfer mask 200 of this invention, even if the treatment of forming the surface modified layer 4a is carried out, the CD variation does not increase so that the in-plane uniformity of the CD before the treatment can be maintained.

As described above, according to the transfer mask manufacturing method of this invention, since the optical properties of the thin film pattern, the CD of the thin film pattern, their in-plane uniformity, or the like is not changed (degraded), no influence is exerted on the transfer mask performance.

Further, it is also suitable for transfer masks which use the double patterning/double exposure techniques. Since these exposure techniques use a set of two transfer masks, the requirement for the accuracy of the two transfer masks is strict. This invention can satisfy such a requirement.

In this invention, the thickness of the surface modified layer is not particularly limited. However, in order to improve the cleaning resistance of the transfer mask of this invention, it is preferably at least 0.5 nm or more. In order to increase the thickness, it is necessary to, for example, prolong the treatment time of the above-mentioned highly concentrated ozone gas treatment. Further, if the thickness is too large, there is a possibility that the change in optical properties or CD may increase. Therefore, the thickness may be enough if it can sufficiently improve the cleaning resistance. From that point of view, the thickness is preferably set to 3 nm or less.

The presence of the surface modified layer can be confirmed by, for example, cross-sectional TEM observation of the thin film and the thickness of the surface modified layer can also be specified.

The transfer mask 200 of this invention has the surface modified layer 4a in the form of the strong oxide film containing the oxide of the transition metal at the surface (surface layer portion) of the thin film pattern 2a. This surface modified layer 4a is the strong oxide film containing the oxide of the transition metal and this strong oxide film contains the metal oxide with a particularly high degree of oxidation, and therefore, it is possible to significantly improve the cleaning resistance to ozone cleaning or the like. Herein, the degree of oxidation of a metal oxide is the constituent number of oxygen atoms per transition metal. In this invention, "high degree of oxidation" represents that the degree of oxidation defined as described above is 1.5 or 2. For example, when the transition metal is chromium, a trivalent or tetravalent chromium oxide ($Cr_2O_3$, $CrO_2$) or the like is classified as a metal oxide with a high degree of oxidation.

The evaluation of the surface modified layer formed in the thin film of the mask blank, described above in FIG. 3, is also applicable to evaluation of the surface modified layer formed in the thin film pattern of the transfer mask.

This invention also provides a transfer mask which is manufactured by the above-mentioned transfer mask manufacturing method. It is possible to improve the cleaning resistance of the transfer mask manufactured by the transfer mask manufacturing method of this invention.

As described above with reference to the embodiments, this invention is suitable for a transfer mask particularly for use in an exposure apparatus that uses short-wavelength exposure light having a wavelength of 200 nm or less as an exposure light source, and for a mask blank for use in the manufacture of such a transfer mask. According to this invention, it is possible to prevent a haze while causing no change in optical properties due to cleaning. For example, this invention is suitable for the following mask blanks and transfer masks.

(1) Binary Mask Blank and Binary Mask in which the thin film comprises a light-shielding film formed with a front-surface antireflection layer made of a material containing a transition metal Binary Mask in which the thin film pattern is a light-shielding film comprising a material containing a transition metal Such a binary mask blank and a binary mask have a structure having a light-shielding film on a transparent substrate. This light-shielding film comprises a material containing a transition metal alone, such as chromium, tantalum, or ruthenium, or containing its compound. For example, there can be cited a light-shielding film made of chromium or a chromium compound in which one or more kinds of elements selected from elements such as oxygen, nitrogen, and carbon is/are added to chromium. Further, there can be cited, for example, a light-shielding film made of a tantalum compound in which one or more kinds of elements selected from elements such as oxygen, nitrogen, and boron is/are added to tantalum. Alternatively, it may be an alloy containing the above-mentioned transition metal and a metal such as aluminum, magnesium, gallium, germanium, or tin, or a compound in which one or more kinds of elements selected from elements such as oxygen, nitrogen, and carbon is/are added to such an alloy.

Such a binary mask blank and a binary mask may be such that the light-shielding film has a two-layer structure of a light-shielding layer and a front-surface antireflection layer, a three-layer structure further comprising a back-surface antireflection layer between the light-shielding layer and the substrate, or the like. When the light-shielding film is formed of chromium compounds, a three-layer structure of a back-surface antireflection layer (CrOCN or the like), a light-shielding layer (CrN, CrON, or the like), and a front-surface antireflection layer (CrOCN or the like) is preferable. When the light-shielding film is formed of molybdenum-silicon (molybdenum-silicide) compounds, a two-layer structure of a light-shielding layer (MoSi, MoSiN, or the like) and a front-surface antireflection layer (MoSiON or the like) is preferable. When the light-shielding film is formed of tantalum compounds, a two-layer structure of a light-shielding layer (TaN or the like) and a front-surface antireflection layer (TaO or the like) is preferable.

The light-shielding film may be a composition gradient film in which the composition in its thickness direction changes continuously or stepwise.

(2) Phase Shift Mask Blank and Phase Shift Mask in which the thin film comprises a light-shielding film formed on a light-semitransmissive film and formed with a front-surface antireflection layer made of a material containing a transition metal Phase Shift Mask in which the thin film pattern comprises a light-shielding film formed on a light-semitransmissive film and comprising a material containing a transition metal Such a phase shift mask blank and a phase shift mask have a structure having a light-semitransmissive film on a transparent substrate. There are mask blanks for a halftone phase shift mask and a tritone phase shift mask which are of the type in which shifter portions are provided by patterning the light-semitransmissive film. As such phase shift masks, there can be cited one with a structure having a light-shielding band at a portion around a transfer region for preventing multiple exposure at the portion around the transfer region and there can be cited one with a structure having a light-semitransmissive film on a transparent substrate and further having a light-shielding film on the light-semitransmissive film for the purpose of preventing pattern failure of a transfer target substrate due to a light-semitransmissive film pattern to be formed in a transfer region based on light transmitted through the light-semitransmissive film. Apart from the halftone phase shift mask blank and the tritone phase shift mask blank, there can be cited mask blanks and transfer masks for a Levenson phase shift mask, a chromeless phase shift mask, and an enhancer phase shift mask which are of the substrate dug-down type in which shifter portions are provided by digging down a transparent substrate by etching or the like.

The light-semitransmissive film is adapted to transmit light having an intensity that does not substantially contribute to exposure (e.g. 1% to 30% at an exposure wavelength) and to provide a predetermined phase difference (e.g. 180 degrees). By means of light-semitransmissive portions formed by patterning the light-semitransmissive film and light-transmissive portions formed with no light-semitransmissive film and adapted to transmit light having an intensity that substantially contributes to exposure, the phase shift mask provides a relationship in which the phase of the light transmitted through the light-semitransmissive portions is substantially inverted with respect to the phase of the light transmitted through the light-transmissive portions. As a consequence, the lights having passed near the boundaries between the light-semitransmissive portions and the light-transmissive portions and bent into the others' regions due to the diffraction phenomenon cancel each other out. This makes the light intensity at the boundaries approximately zero to thereby improve the contrast, i.e. the resolution, at the boundaries.

The light-semitransmissive film is made of a material containing, for example, a compound of a transition metal and silicon (transition metal silicide) and there can be cited a material composed mainly of these transition metal and silicon and oxygen and/or nitrogen. As the transition metal, use can be made of molybdenum, tantalum, tungsten, titanium, hafnium, nickel, vanadium, zirconium, niobium, palladium, ruthenium, rhodium, an alloy containing two or more kinds of them, or the like.

The light-shielding film formed with the front-surface antireflection layer made of the material containing the transition metal may be made of the same material and have the same structure as those of the light-shielding film described above in (1). When a material of the light-semitransmissive film contains a transition metal and silicon, a material of the light-shielding film preferably comprises particularly chromium having etching selectivity (etching resistance) to the light-semitransmissive film or a chromium compound in which an element/elements such as oxygen, nitrogen, and carbon is/are added to chromium.

In the case of a phase shift mask having a light-shielding film on a light-semitransmissive film, when a material of the light-semitransmissive film contains a transition metal and silicon, a material of the light-shielding film preferably comprises particularly chromium having etching selectivity (etching resistance) to the light-semitransmissive film or a chromium compound in which an element/elements such as oxygen, nitrogen, and carbon is/are added to chromium. The light-shielding film may be a composition gradient film in which the composition in its thickness direction changes continuously or stepwise.

In particular, when the light-semitransmissive film is made of a material containing molybdenum and silicon and the light-shielding film is made of a material containing chromium, there arises a problem that since the cleaning resistance of the light-shielding film to ozone water cleaning is lower than that of the light-semitransmissive film, when the number of times of cleaning of the transfer mask increases, even if the optical properties of a light-semitransmissive film pattern do not change, a light-shielding film pattern is subjected to a film loss, resulting in a change in optical properties. However, by forming a surface modified layer in the light-shielding film pattern, it is possible to suppress a change in the optical properties of the light-shielding film pattern and thus to improve the cleaning resistance of the phase shift mask.

(3) Binary Mask Blank and Binary Mask in which the thin film comprises an etching mask film formed on a light-shielding film and made of a material containing a transition metal to have an antireflection function Binary Mask in which the thin film pattern comprises an etching mask film formed on a light-shielding film and made of a material containing a transition metal Such a binary mask blank and a binary mask have a structure having a pattern of a light-shielding film and an etching mask film (antireflection film) on a transparent substrate. The light-shielding film comprises a material containing a compound of a transition metal and silicon and there can be cited a material composed mainly of these transition metal and silicon and oxygen and/or nitrogen. Alternatively, there can be cited a material composed mainly of a transition metal and oxygen, nitrogen, and/or boron. As the transition metal, use can be made of molybdenum, tantalum, tungsten, titanium, hafnium, nickel, vanadium, zirconium, niobium, palladium, ruthenium, rhodium, an alloy containing two or more kinds of them, or the like. Alternatively, it may be an alloy containing the above-mentioned transition metal and a metal such as aluminum, magnesium, gallium, germanium, or tin.

When the light-shielding film is formed of molybdenum-silicon (molybdenum-silicide) compounds, it may have a two-layer structure of a light-shielding layer (MoSi, MoSiN, or the like) and a front-surface antireflection layer (MoSiON or the like) or a three-layer structure further comprising a back-surface antireflection layer (MoSiON or the like) between the light-shielding layer and the substrate. When the light-shielding film is formed of tantalum compounds, it may have a two-layer structure of a light-shielding layer (TaN or the like) and a front-surface antireflection layer (TaO or the like). Since the etching mask film is provided, the front-surface antireflection layer may be omitted.

The light-shielding film may be a composition gradient film in which the composition in its thickness direction changes continuously or stepwise.

While the etching mask film is provided on the light-shielding film for the purpose of reducing the thickness of a resist film to thereby form a fine pattern, the etching mask film also has the antireflection function and serves as an antireflection film pattern when a transfer mask is manufactured. This etching mask film is preferably made of a material comprising particularly chromium having etching selectivity (etching resistance) to etching of the light-shielding film containing the transition metal silicide and so on or comprising a chromium compound in which an element/elements such as oxygen, nitrogen, and carbon is/are added to chromium.

In (1) to (3), an etching stopper film having etching resistance to the light-shielding film or the light-semitransmissive film may be provided between the transparent substrate and the light-shielding film or between the light-semitransmissive film and the light-shielding film.

(4) Reflective Mask Blank and Reflective Mask in which the thin film comprises an absorber film having a front-surface antireflection layer made of a material containing a transition metal (particularly, tantalum)

Reflective Mask in which the thin film pattern comprises an absorber film comprising a material containing a transition metal (particularly, tantalum)

Such a reflective mask blank and a reflective mask comprise a multilayer reflective film formed on a substrate and adapted to reflect exposure light, a buffer film formed in a pattern on the multilayer reflective film, and further an absorber film formed in a pattern on the buffer film and adapted to absorb the exposure light. The buffer film is provided between the multilayer reflective film and the absorber film for the purpose of protecting the multilayer reflective film in pattern forming and correcting processes of the absorber film. The buffer film may be omitted.

The absorber film may be satisfactory as long as it has a function of absorbing, for example, EUV light as exposure light. As the material containing tantalum, particularly Ta alone or a material composed mainly of Ta can be preferably used. The material composed mainly of Ta is, for example, an alloy of Ta. The crystalline state of such an absorber film preferably has an amorphous or microcrystalline structure in terms of smoothness and flatness. As the material composed mainly of Ta, it is possible to suitably use, for example, a material containing Ta and B, a material containing Ta and N, a material containing Ta and B and further containing at least one of O and N, or the like. The absorber film has a laminated structure comprising the front-surface antireflection layer and a lower layer other than that. The front-surface antireflection layer is preferably formed of a material containing an oxide, a nitride, an oxynitride, or a carbide of tantalum (Ta).

As the substrate, use can be made of a $SiO_2$—$TiO_2$-based glass or a quartz glass or of a crystallized glass precipitated with β-quartz solid solution or the like in the case of a crystallized glass. As an example of a metal substrate, an Invar alloy (Fe—Ni-based alloy) or the like can be cited. It is also possible to use a single-crystal silicon substrate.

The transfer mask may be a binary mask which does not use the phase shift effect and, among phase shift masks which use the phase shift effect, the transfer mask may be a halftone phase shift mask, a tritone phase shift mask, a Levenson phase shift mask, a chromeless phase shift mask, an enhancer mask, a reflective mask, or the like. The transfer mask may be a reticle.

EXAMPLES

Hereinbelow, the embodiments of this invention will be described in further detail with reference to Examples.

Example 1

Using a synthetic quartz glass substrate having a 6-inch square size with a thickness of 0.25 inches as a transparent substrate, a light-semitransmissive film made of nitrided molybdenum and silicon was first formed on the transparent substrate.

Specifically, using a mixed target of molybdenum (Mo) and silicon (Si) (Mo:Si=10 mol %:90 mol %), reactive sputtering (DC sputtering) was carried out by setting the power of a DC power supply to 3.0 kW in a mixed gas atmosphere of argon (Ar), nitrogen ($N_2$), and helium (He) (gas flow rate ratio Ar:N$_2$:He=5:49:46) at a gas pressure of 0.3 Pa, thereby forming a MoSiN film made of molybdenum, silicon, and nitrogen and having a thickness of 69 nm. Then, a heat treatment was applied to the substrate formed with the MoSiN film using a heating furnace in the atmosphere at a heating temperature of 450° C. for a heating time of 1 hour. The MoSiN film had a transmittance of 6.16% and a phase difference of 184.4 degrees for ArF excimer laser.

Then, the following light-shielding film having a front-surface antireflection layer was formed on the light-semitransmissive film.

Specifically, using a chromium (Cr) target as a sputtering target, reactive sputtering (DC sputtering) was carried out by setting the power of a DC power supply to 1.7 kW in a mixed gas atmosphere of argon (Ar), carbon dioxide (CO$_2$), nitrogen (N$_2$), and helium (He) (gas pressure 0.2 Pa, gas flow rate ratio Ar:CO$_2$:N$_2$:He=20:35:10:30), thereby forming a CrOCN layer having a thickness of 30 nm. Subsequently, reactive sputtering (DC sputtering) was carried out by setting the power of a DC power supply to 1.7 kW in a mixed gas atmosphere of argon (Ar) and nitrogen (N$_2$) (gas pressure 0.1 Pa, gas flow rate ratio Ar:N$_2$=25:5), thereby forming a CrN layer having a thickness of 4 nm. Finally, reactive sputtering (DC sputtering) was carried out by setting the power of a DC power supply to 1.7 kW in a mixed gas atmosphere of argon (Ar), carbon dioxide (CO$_2$), nitrogen (N$_2$), and helium (He) (gas pressure 0.2 Pa, gas flow rate ratio Ar:CO$_2$:N$_2$:He=20:35:5:30), thereby forming a CrOCN layer having a thickness of 14 nm. In this manner, a chromium-based light-shielding film of a three-layer laminated structure having a total thickness of 48 nm was formed.

This light-shielding film was adjusted so that the optical density (OD) was 3.0 at the wavelength 193 nm of ArF excimer laser exposure light in the form of the laminated structure with the above-mentioned light-semitransmissive film. The front-surface reflectance of the light-shielding film was 20% at the wavelength 193 nm of the exposure light. Further, the optical density of the above-mentioned laminated structure was measured at 25 in-plane portions to measure in-plane variation (in-plane uniformity) of the optical density. As a result, it was 0.02 in terms of 3σ (σ is a standard deviation). The optical density was measured using a spectrophotometer (manufactured by Shimadzu Corporation: ss3700).

The surface roughness of a surface of the light-shielding film was measured using an atomic force microscope (AFM) (measurement area 1 μm×1 μm). As a result, Ra=0.56 nm. Further, the flatness in 142 mm×142 mm was measured using a flatness measuring apparatus (manufactured by TROPEL Corporation: UltraFlat200M). As a result, it was 310 nm.

With respect to a mask blank in which the light-semitransmissive film and the light-shielding film were formed on the glass substrate as described above, a highly concentrated ozone gas (100 vol %) and an ethylene gas were supplied and mixed together near the surface of the light-shielding film, thereby carrying out a treatment of causing the highly concentrated ozone gas and the ethylene gas to act on the surface of the light-shielding film. In this event, the flow rate ratio of the ozone gas to the ethylene gas was set to 2:1. The treatment time (time for causing the ozone gas and the ethylene gas to act) was set to 10 minutes and the substrate was heated to 60° C.

In the manner described above, a phase shift mask blank having a pattern-forming thin film of the laminated structure comprising the light-semitransmissive film and the light-shielding film on the glass substrate was manufactured.

A section of the thin film of the laminated structure of the manufactured phase shift mask blank was observed in detail using TEM (transmission electron microscope). As a result, a coating film (surface modified layer) with a thickness of about 1 nm was formed at a surface layer portion of the front-surface antireflection layer in the light-shielding film. Further, the composition of this coating film was analyzed in detail using X-ray photoelectron spectroscopy by setting the inclination of a detector to 30° with respect to a surface. As a result, the elemental composition (at % ratio) was Cr:16.6, O:40.6, N:5.5; C:37.3. Further, the atomic ratios to the number of chromium atoms are O/Cr=2.44, N/Cr=0.33, and C/Cr=2.24.

The surface roughness of the surface of the thin film, i.e. the surface of the surface modified layer, was measured using an atomic force microscope (AFM) (measurement area 1 μm×1 μm). As a result, Ra=0.46 nm. That is, compared to the surface roughness Ra=0.56 nm of the surface of the light-shielding film before applying the above-mentioned treatment by the highly concentrated ozone gas and the ethylene gas, the surface roughness was reduced by 0.10 nm before and after the treatment (reduction ratio was 0.10/0.56×100=18%). Thus, the surface roughness was not degraded and was reduced. Further, cross-sectional TEM observation was carried out. As a result, a reduction in surface roughness and a reduction in grain size were confirmed before and after the treatment.

Further, the optical density of the laminated film comprising the light-semitransmissive film and the light-shielding film after the treatment was 3.0 and thus there was no change from that before the treatment. The front-surface reflectance of the light-shielding film at the wavelength 193 nm of ArF excimer laser exposure light and the front-surface reflectance of the light-shielding film at the wavelength 488 nm of inspection light were also confirmed. As a result, almost no changes were observed from those before the treatment. The in-plane variation of the optical density of the laminated film was 0.02 in terms of 3σ and thus there was no change from that before the treatment.

Further, the flatness in 142 mm×142 mm was measured using a flatness measuring apparatus (manufactured by TROPEL Corporation: UltraFlat200M). As a result, it was 306 nm. Therefore, the amount of change in flatness was 4 nm and thus there was almost no change.

Accordingly, it was confirmed that the surface modified layer was formed without changing (degrading) the flatness of the mask blank, the surface roughness of the thin film, the optical properties of the thin film, or the in-plane uniformity of the optical properties of the thin film before and after the highly concentrated ozone gas treatment.

FIG. 3 shows the results of analysis by X-ray photoelectron spectroscopy of the surface modified layer in this Example, wherein (a) is O (oxygen) 1 s spectra of the surface modified layer and (b) is O1 s spectra of the surface layer portion of the light-shielding film before applying the above-mentioned treatment using the highly concentrated ozone gas and the ethylene gas.

The surface modified layer is such that when an O1 s spectrum measured by XPS is separated into a first peak at a binding energy of about 532 eV and a second peak at a binding energy of about 530 eV, the ratio of the first peak area to the second peak area is 2.8. The first peak is formed mainly by a chromium oxide component with a high degree of oxidation (Cr$_2$O$_3$ or the like) and an organic-based oxygen component (defined as components A). The second peak is formed mainly by a chromium oxide component with a low degree of oxidation (CrO or the like) and a chromium oxynitride component (defined as components B). From these analysis results, it is seen that the components A are 74% while the components B are 26% and that, by the formation of the surface modified layer at the surface of the pattern-forming thin film due to the above-mentioned highly concentrated ozone gas treatment, the ratio of the components A is increased while the ratio of the components B is reduced compared to the state before applying the highly concentrated ozone gas treatment where the surface modified layer is not formed (spectra of (b) described above). Further, in the O1 s spectra, the first peak intensity before applying the highly concentrated ozone gas treatment is about 7400 c/s while the first peak intensity after applying the highly concentrated ozone gas treatment is about 9500 c/s. It is seen that the first peak is increased by the highly concentrated ozone gas treatment.

While rotating the manufactured phase shift mask blank of this Example by an electric motor or the like, ozone cleaning was carried out by supplying 50 ppm ozone water (room temperature) to the laminated film from a cleaning solution supply nozzle for 75 minutes. The conditions of this method are harder than those of ozone cleaning which is usually carried out. After the ozone cleaning, the optical density of the thin film was measured. As a result, it was 3.0 at the wavelength 193 nm of ArF excimer laser exposure light and thus there was almost no decrease in optical density. Further, the thin film was confirmed by cross-sectional TEM. As a result, the film loss was suppressed to be very small. The front-surface reflectance at the wavelength 193 nm of ArF excimer laser exposure light was also confirmed. As a result, almost no change was observed from that before the ozone water cleaning. That is, it was confirmed that the phase shift mask blank of this Example had extremely high ozone cleaning resistance.

Example 2

A phase shift mask blank was manufactured in the same manner as in Example 1 except that, in Example 1, with respect to the mask blank in which the light-semitransmissive film and the light-shielding film were laminated on the glass substrate, the treatment time for causing the highly concentrated ozone gas (100 vol %) and the ethylene gas to act on the surface of the light-shielding film was set to 30 minutes.

A section of the thin film of the laminated structure of the manufactured phase shift mask blank of this Example was observed in detail using TEM (transmission electron microscope). As a result, a coating film (surface modified layer) with a thickness of about 2 nm was formed at a surface layer portion of the front-surface antireflection layer in the light-shielding film. Further, the composition of this coating film was analyzed using X-ray photoelectron spectroscopy by setting the inclination of a detector to 30° with respect to a surface. As a result, the elemental composition (at % ratio) was Cr:17.9, 0:43.1, N:4.6; C:34.4. Further, the atomic ratios to the number of chromium atoms are O/Cr=2.41, N/Cr=0.26, and C/Cr=1.92.

The surface roughness of the surface of the surface modified layer was measured using an atomic force microscope (AFM) (measurement area 1 μm×1 μm). As a result, Ra=0.46 nm. Thus, compared to the surface roughness Ra=0.56 nm of the surface of the light-shielding film before applying the above-mentioned treatment by the highly concentrated ozone gas, the surface roughness was reduced by 0.10 nm before and after the treatment (reduction ratio was 0.10/0.56× 100=18%). Thus, the surface roughness was not degraded and was reduced. Further, cross-sectional TEM observation was carried out. As a result, a reduction in surface roughness and a reduction in grain size were confirmed before and after the treatment.

Further, the optical density of the laminated film comprising the light-semitransmissive film and the light-shielding film after the treatment was 3.0 and thus there was no change from that before the treatment. The front-surface reflectance of the light-shielding film at the wavelength 193 nm of ArF excimer laser exposure light and the front-surface reflectance of the light-shielding film at the wavelength 488 nm of inspection light were also confirmed. As a result, almost no changes were observed from those before the treatment. The in-plane variation of the optical density of the laminated film was 0.02 in terms of $3\sigma$ and thus there was no change from that before the treatment.

Further, the flatness was measured in the same manner as in Example 1. As a result, it was 306 nm. Therefore, the amount of change in flatness was 4 nm and thus there was almost no change.

In the same manner as in Example 1, the surface modified layer in this Example was analyzed by XPS. As a result, when an O1 s spectrum was separated into a first peak at a binding energy of about 532 eV and a second peak at a binding energy of about 530 eV, the ratio of the first peak area to the second peak area was 2.2. From these analysis results, the ratio of components A such as mainly a chromium oxide component with a high degree of oxidation ($Cr_2O_3$ or the like) and an organic-based oxygen component in the surface modified layer was 69% while the ratio of components B such as mainly a chromium oxide component with a low degree of oxidation and a chromium oxynitride component in the surface modified layer was 31%. In the O1 s spectra, the first peak intensity after applying the highly concentrated ozone gas treatment was about 10500 c/s and thus was increased than that before the treatment.

The manufactured phase shift mask blank of this Example was subjected to ozone cleaning under the same conditions as in Example 1 and then the optical density of the thin film was measured. As a result, it was 3.0 and thus there was almost no decrease in optical density. Further, the thin film was confirmed by cross-sectional TEM. As a result, the film loss was suppressed to be very small. The front-surface reflectance was also confirmed. As a result, almost no change was observed from that before the ozone water cleaning. That is, it was confirmed that the phase shift mask blank of this Example had extremely high ozone cleaning resistance.

Example 3

Using a synthetic quartz glass substrate having a 6-inch square size with a thickness of 0.25 inches as a transparent substrate, a light-semitransmissive film, which was the same as that in Example 1, was formed on the transparent substrate, then heating was carried out, and then the following light-shielding film having a front-surface antireflection layer was formed.

Specifically, using a chromium (Cr) target as a sputtering target, reactive sputtering (DC sputtering) was carried out by setting the power of a DC power supply to 0.8 kW in a mixed gas atmosphere of argon (Ar), nitrogen ($N_2$), and helium (He) (gas pressure 0.2 Pa, gas flow rate ratio Ar:$N_2$:He=30:30:40), thereby forming a CrN film having a thickness of 24 nm. Subsequently, reactive sputtering (DC sputtering) was carried out by setting the power of a DC power supply to 0.3 kW in a mixed gas atmosphere of argon (Ar), methane ($CH_4$), nitrogen monoxide (NO), and helium (He) (gas pressure 0.3 Pa, gas flow rate ratio Ar+$CH_4$:NO:He=65:3:40), thereby forming a CrON (C) film having a thickness of 24 nm. In this manner, a chromium-based light-shielding film of a two-layer laminated structure having a total thickness of 48 nm was formed. Since this light-shielding film was formed using an in-line sputtering apparatus, the CrN film and the CrON (C) film were in the form of a gradient film in which the composition was gradient in its thickness direction.

This light-shielding film was adjusted so that the optical density (OD) was 3.0 at the wavelength 193 nm of ArF excimer laser exposure light in the form of the laminated structure with the above-mentioned light-semitransmissive film. The front-surface reflectance of the light-shielding film was 20% at the wavelength 193 nm of ArF excimer laser exposure light. Further, the optical density of the above-mentioned laminated structure was measured at 25 in-plane portions to measure in-plane variation (in-plane uniformity) of the optical density. As a result, it was 0.03 in terms of 3σ (σ is a standard deviation).

The surface roughness of a surface of the light-shielding film was measured using an atomic force microscope (AFM) (measurement area 1 μm×1 μm). As a result, Ra=0.73 nm.

With respect to a mask blank in which the light-semitransmissive film and the light-shielding film were formed on the glass substrate as described above, a highly concentrated ozone gas was supplied, thereby carrying out a treatment of causing the highly concentrated ozone gas to act on the surface of the light-shielding film. In this event, the concentration of the ozone gas was set to 100 vol %. The treatment time (time for causing the ozone gas to act) was set to 10 minutes and the substrate was heated to 60° C.

In the manner described above, a phase shift mask blank having a pattern-forming thin film of the laminated structure comprising the light-semitransmissive film and the light-shielding film on the glass substrate was manufactured.

A section of the thin film of the laminated structure of the manufactured phase shift mask blank was observed in detail using TEM (transmission electron microscope). As a result, a coating film (surface modified layer) with a thickness of about 1 nm was formed at a surface layer portion of the front-surface antireflection layer in the light-shielding film.

The surface roughness of a surface of the surface modified layer was measured using an atomic force microscope (AFM) (measurement area 1 μm×1 μm). As a result, Ra=0.64 nm. That is, compared to the surface roughness Ra=0.73 nm of the surface of the light-shielding film before applying the above-mentioned treatment by the highly concentrated ozone gas, the surface roughness was reduced by 0.09 nm before and after the treatment (reduction ratio was 0.09/0.73× 100=12%). Thus, the surface roughness was not degraded and was reduced. Further, cross-sectional TEM observation was carried out. As a result, a reduction in surface roughness and a reduction in grain size were confirmed before and after the treatment.

Further, the optical density of the laminated film comprising the light-semitransmissive film and the light-shielding film after the treatment was 3.0 and thus there was no change from that before the treatment. The front-surface reflectance of the light-shielding film at the wavelength 193 nm of ArF excimer laser exposure light and the front-surface reflectance of the light-shielding film at the wavelength 488 nm of inspection light were also confirmed. As a result, almost no changes were observed from those before the treatment. The in-plane variation of the optical density of the laminated film was 0.02 in terms of 3σ and thus there was almost no change from that before the treatment.

The manufactured mask blank of this Example was subjected to ozone cleaning under the same conditions as in Example 1 and then the optical density of the thin film was measured. As a result, it was 3.0 and thus there was almost no decrease in optical density. Further, the thin film was confirmed by cross-sectional TEM. As a result, the film loss was suppressed to be very small. The front-surface reflectance was also confirmed. As a result, almost no change was observed from that before the ozone cleaning. That is, it was confirmed that the mask blank of this Example had extremely high ozone cleaning resistance.

Example 4

Using a synthetic quartz glass substrate having a 6-inch square size with a thickness of 0.25 inches as a transparent substrate, a MoSiON film (back-surface antireflection layer) and a MoSi film (light-shielding layer) were formed as a light-shielding film on the transparent substrate.

Specifically, using a mixed target of Mo and Si (Mo:Si=21 mol %:79 mol %), a film made of molybdenum, silicon, oxygen, and nitrogen and having a thickness of 6 nm was formed by setting the power of a DC power supply to 3.0 kW in Ar, $O_2$, $N_2$, and He (gas flow rate ratio Ar:$O_2$:$N_2$:He=5:4:49:42) at a sputtering gas pressure of 0.2 Pa. Subsequently, using the same target, a film made of molybdenum and silicon and having a thickness of 31 nm was formed by setting the power of a DC power supply to 2.0 kW in Ar at a sputtering gas pressure of 0.1 Pa.

Then, the following Cr-based etching mask film adapted to also serve as an antireflection film was formed on the above-mentioned MoSi-based light-shielding film.

Specifically, using a chromium (Cr) target as a sputtering target, reactive sputtering (DC sputtering) was carried out by setting the power of a DC power supply to 1.7 kW in a mixed gas atmosphere of argon (Ar), nitrogen ($N_2$), and oxygen ($O_2$) (gas pressure 0.2 Pa, gas flow rate ratio Ar:$N_2$:$O_2$=30:35:35), thereby forming a CrON layer having a thickness of 17 nm.

The total thickness of the light-shielding film and the etching mask film was set to 54 nm. The optical density (OD) of the light-shielding film and the etching mask film was 3.0 at the wavelength 193 nm of ArF excimer laser exposure light. The front-surface reflectance of the light-shielding film was 16% at the wavelength 193 nm of ArF excimer laser exposure light.

With respect to a mask blank in which the MoSi-based light-shielding film and the Cr-based etching mask film were laminated on the glass substrate as described above, a treatment of causing a mixed gas of highly concentrated ozone gas and ethylene gas to act on a surface of the Cr-based etching mask film was carried out. In this event, the flow rate ratio of the ozone gas to the ethylene gas was set to 2:1. The treatment time (time for causing the ozone gas and the ethylene gas to act) was set to 10 minutes and the substrate was heated to 60° C.

In the manner described above, a binary mask blank having the pattern-forming MoSi-based light-shielding film and Cr-based etching mask film on the glass substrate was manufactured.

A section of the Cr-based etching mask film of the manufactured binary mask blank was observed in detail using TEM (transmission electron microscope). As a result, a coating film (surface modified layer) with a thickness of about 1 nm was formed at a surface layer portion of the etching mask film.

Further, cross-sectional TEM observation was carried out. As a result, a reduction in surface roughness and a reduction in grain size were confirmed before and after the treatment.

Further, the optical density of the laminated film comprising the light-shielding film and the etching mask film after the treatment was 3.0 and thus there was no change from that before the treatment. The front-surface reflectance of the etching mask film at the wavelength 193 nm of ArF excimer laser exposure light and the front-surface reflectance of the etching mask film at the wavelength 488 nm of inspection light were also confirmed. As a result, almost no changes were observed from those before the treatment.

The manufactured mask blank of this Example was subjected to ozone cleaning under the same conditions as in Example 1 and then the optical density of the thin film was measured. As a result, it was 3.0 and thus there was almost no decrease in optical density. Further, the thin film was confirmed by cross-sectional TEM. As a result, the film loss was suppressed to be very small. The front-surface reflectance was also confirmed. As a result, almost no change was observed from that before the ozone cleaning. That is, it was confirmed that the mask blank of this Example had extremely high ozone cleaning resistance.

Comparative Example 1

A phase shift mask blank was manufactured in the same manner as in Example 1 except that, in Example 1, with respect to the mask blank in which the light-semitransmissive film and the light-shielding film were laminated on the glass substrate, the treatment of causing the highly concentrated ozone gas and the ethylene gas to act on the surface of the front-surface antireflection layer in the light-shielding film was omitted.

The composition of a surface layer portion of the light-shielding film of the manufactured phase shift mask blank of this Comparative Example was analyzed in detail using X-ray photoelectron spectroscopy by setting the inclination of a detector to 30° with respect to a surface. As a result, the elemental composition (at % ratio) was Cr:18.5, O:36.1, N:8.5; C:36.9. Further, the atomic ratios to the number of chromium atoms are O/Cr=1.94, N/Cr=0.46, and C/Cr=1.99.

The optical density of the light-semitransmissive film and the light-shielding film was 3.0. The front-surface reflectance of the light-shielding film at the wavelength 193 nm of ArF excimer laser exposure light was 20%.

The surface roughness of the surface of the light-shielding film was measured using an atomic force microscope (AFM) (measurement area 1 µm×1 µm). As a result, Ra=0.56 nm.

The results of analysis by XPS of the light-shielding film in this Comparative Example are shown at (b) in FIG. 3 described before. When an O1 s spectrum was separated into a first peak at a binding energy of about 532 eV and a second peak at a binding energy of about 530 eV, the ratio of the first peak area to the second peak area was 1.4. From these analysis results, the ratio of components A such as mainly a chromium oxide component with a high degree of oxidation ($Cr_2O_3$ or the like) and an organic-based oxygen component was 58% while the ratio of components B such as mainly a chromium oxide component with a low degree of oxidation (CrO or the like) and a chromium oxynitride component was 42%. Compared to the results of the Examples described before, the ratio of the components A was relatively low and the ratio of the components B was relatively high.

The manufactured mask blank of this Comparative Example was subjected to ozone cleaning under the same conditions as in Example 1 and then the optical density of the thin film was measured. As a result, it was 2.8 and thus was significantly decreased. The front-surface reflectance of the light-shielding film at the wavelength 193 nm of ArF excimer laser exposure light was also confirmed. As a result, it was 35%. From this, it was seen that the ozone cleaning resistance was low.

Example 5

A phase shift mask blank having a pattern-forming thin film of a laminated structure comprising a light-semitransmissive film and a light-shielding film on a glass substrate was manufactured in the same manner as in Example 1. This phase shift mask blank was not subjected to the highly concentrated ozone gas treatment of Example 1.

Then, a halftone phase shift mask was manufactured using the above-mentioned phase shift mask blank.

First, a chemically amplified negative resist film for electron beam writing (manufactured by FUJIFILM Electronic Materials Co., Ltd.: SLV08) was formed as a resist film on the mask blank. The resist film was formed by spin coating using a spinner (spin coating apparatus). After the resist film was coated, a predetermined heating drying treatment was carried out. The thickness of the resist film was set to 165 nm.

Then, using an electron beam writing apparatus, a required pattern was written on the resist film formed on the mask blank and, thereafter, the resist film was developed with a predetermined developer, thereby forming a resist pattern. Then, using the resist pattern as a mask, the light-shielding film was etched. A mixed gas of $Cl_2$ and $O_2$ was used as a dry etching gas. Subsequently, the light-semitransmissive film (MoSiN film) was etched, thereby forming a light-semitransmissive film pattern. A mixed gas of $SF_6$ and He was used as a dry etching gas.

Then, the remaining resist pattern was stripped. Then, again, the same resist film as described above was formed over the entire surface. Then, writing for forming a light-shielding band at an outer peripheral portion of a mask was carried out. After the writing, the resist film was developed to form a resist pattern. Using this resist pattern as a mask, the light-shielding film in other than a light-shielding band region was removed by etching.

The remaining resist pattern was stripped, thereby obtaining a phase shift mask. There was almost no change in the transmittance or the phase difference of the light-semitransmissive film or in the optical density of the laminated film comprising the light-semitransmissive film and the light-shielding film compared to those at the time of the manufacture of the mask blank.

With respect to the phase shift mask thus obtained, a highly concentrated ozone gas (100 vol %) and an ethylene gas were supplied and mixed together near a surface of a thin film pattern comprising the light-semitransmissive film pattern and the light-shielding film pattern, thereby carrying out a treatment of causing the highly concentrated ozone gas and the ethylene gas to act on the surface of the thin film pattern. In this event, the flow rate ratio of the ozone gas to the ethylene gas was set to 2:1. The treatment time (time for causing the ozone gas and the ethylene gas to act) was set to 10 minutes and the substrate was heated to 60° C.

A section of the thin film pattern of the laminated structure of the manufactured phase shift mask was observed in detail using TEM (transmission electron microscope). As a result, a coating film (surface modified layer) with a thickness of about 1 nm was uniformly formed at a surface layer portion and side walls of the light-shielding film pattern. This surface modified layer was substantially the same as the surface modified layer which was formed at the surface of the light-shielding film in the mask blank of Example 1 when the highly concentrated ozone gas treatment was carried out for 10 minutes.

The optical density of the laminated film comprising the light-semitransmissive film pattern and the light-shielding film pattern after the treatment was 3.0 and thus there was no change from that before the treatment. The front-surface reflectance of the light-semitransmissive film pattern and the light-shielding film pattern at the wavelength 257 nm of inspection light was also confirmed. As a result, almost no change was observed from that before the treatment. Further, there was no change in the CD, the CD variation, the transmittance, or the phase difference of the light-semitransmissive film pattern after the treatment compared to those before the treatment.

Accordingly, it was confirmed that the surface modified layer was formed without changing (degrading) the optical properties, the CD, or the CD variation of the thin film pattern before and after the highly concentrated ozone gas treatment.

While rotating the manufactured phase shift mask of this Example by an electric motor or the like, ozone cleaning was carried out by supplying 50 ppm ozone water (room temperature) to the laminated film from a cleaning solution supply nozzle for 75 minutes. The conditions of this method are harder than those of ozone cleaning which is usually carried out. After the ozone cleaning, the optical density of the laminated film was measured. As a result, it was 3.0 at the wavelength 193 nm of ArF excimer laser exposure light and thus there was almost no decrease in optical density. Further, the thin film pattern was confirmed by cross-sectional TEM. As a result, the change in CD was suppressed to be very small. The front-surface reflectance of the light-semitransmissive film pattern and the light-shielding film pattern at the wavelength 257 nm of inspection light was also confirmed. As a result, almost no change was observed from that before the ozone water cleaning. That is, it was confirmed that the phase shift mask of this Example had extremely high ozone cleaning resistance.

Example 6

A phase shift mask was manufactured in the same manner as in Example 5 except that, in Example 5, with respect to the phase shift mask in which the light-semitransmissive film and the light-shielding film were laminated on the glass substrate, the treatment time for causing the highly concentrated ozone gas (100 vol %) and the ethylene gas to act on the surface of the thin film pattern was set to 30 minutes.

A section of the thin film pattern of the laminated structure of the manufactured phase shift mask of this Example was observed in detail using TEM (transmission electron microscope). As a result, a coating film (surface modified layer) with a thickness of about 2 nm was uniformly formed at a surface layer portion and side walls of the light-shielding film pattern. This surface modified layer was substantially the same as the surface modified layer which was formed at the surface of the light-shielding film in the mask blank of Example 2 when the highly concentrated ozone gas treatment was carried out for 30 minutes.

The optical density of the laminated film comprising the light-semitransmissive film pattern and the light-shielding film pattern after the treatment was 3.0 and thus there was no change from that before the treatment. The front-surface reflectance of the light-semitransmissive film pattern and the light-shielding film pattern at the wavelength 257 nm of inspection light was also confirmed. As a result, almost no change was observed from that before the treatment. Further, there was no change in the CD, the CD variation, the transmittance, or the phase difference of the light-semitransmissive film pattern after the treatment compared to those before the treatment.

Accordingly, it was confirmed that the surface modified layer was formed without changing (degrading) the optical properties, the CD, or the CD variation of the thin film pattern before and after the highly concentrated ozone gas treatment.

The manufactured phase shift mask of this Example was subjected to ozone cleaning under the same conditions as in Example 5 and then the optical density of the laminated film was measured. As a result, it was 3.0 and thus there was almost no decrease in optical density. Further, the thin film pattern was confirmed by cross-sectional TEM. As a result, the change in CD was suppressed to be very small. The front-surface reflectance of the light-semitransmissive film pattern and the light-shielding film pattern at the wavelength 257 nm of inspection light was also confirmed. As a result, almost no change was observed from that before the ozone water cleaning. That is, it was confirmed that the phase shift mask of this Example had extremely high ozone cleaning resistance.

Example 7

A phase shift mask blank having a pattern-forming thin film of a laminated structure comprising a light-semitransmissive film and a light-shielding film on a glass substrate was manufactured in the same manner as in Example 3. This phase shift mask blank was not subjected to the highly concentrated ozone gas treatment of Example 3.

Then, a halftone phase shift mask was manufactured using the above-mentioned phase shift mask blank in the same manner as in Example 5.

With respect to the phase shift mask thus obtained, a highly concentrated ozone gas was supplied, thereby carrying out a treatment of causing the highly concentrated ozone gas to act on a surface of a thin film pattern comprising a light-semitransmissive film pattern and a light-shielding film pattern. In this event, the concentration of the ozone gas was set to 100 vol %. The treatment time (time for causing the ozone gas to act) was set to 10 minutes and the substrate was heated to 60° C.

A section of the thin film pattern of the laminated structure of the manufactured phase shift mask was observed in detail using TEM (transmission electron microscope). As a result, a coating film (surface modified layer) with a thickness of about 1 nm was uniformly formed at a surface layer portion and side walls of the light-shielding film pattern.

The optical density of the laminated film comprising the light-semitransmissive film pattern and the light-shielding film pattern after the treatment was 3.0 and thus there was no change from that before the treatment. The front-surface reflectance of the light-semitransmissive film pattern and the light-shielding film pattern at the wavelength 257 nm of inspection light was also confirmed. As a result, almost no change was observed from that before the treatment. Further, there was no change in the CD, the CD variation, the transmittance, or the phase difference of the light-semitransmissive film pattern after the treatment compared to those before the treatment.

Accordingly, it was confirmed that the surface modified layer was formed without changing (degrading) the optical properties or the CD of the thin film pattern before and after the highly concentrated ozone gas treatment.

The manufactured phase shift mask of this Example was subjected to ozone cleaning under the same conditions as in Example 5 and then the optical density of the laminated film was measured. As a result, it was 3.0 and thus there was almost no decrease in optical density. Further, the thin film pattern was confirmed by cross-sectional TEM. As a result, the change in CD was suppressed to be very small. The front-surface reflectance of the light-semitransmissive film pattern and the light-shielding film pattern at the wavelength 257 nm of inspection light was also confirmed. As a result, almost no change was observed from that before the ozone cleaning. That is, it was confirmed that the phase shift mask of this Example had extremely high ozone cleaning resistance.

Example 8

Using a synthetic quartz glass substrate having a 6-inch square size with a thickness of 0.25 inches as a transparent substrate, the following light-shielding film was formed on the transparent substrate.

Specifically, using a chromium (Cr) target as a sputtering target, reactive sputtering (DC sputtering) was carried out by setting the power of a DC power supply to 1.7 kW in a mixed gas atmosphere of argon (Ar), carbon dioxide ($CO_2$), nitrogen ($N_2$), and helium (He) (gas pressure 0.2 Pa, gas flow rate ratio Ar:$CO_2$:$N_2$:He=20:35:10:30), thereby forming a CrOCN layer having a thickness of 39 nm. Subsequently, reactive sputtering (DC sputtering) was carried out by setting the power of a DC power supply to 1.7 kW in a mixed gas atmosphere of argon (Ar), nitrogen monoxide (NO), and helium (He) (gas pressure 0.1 Pa, gas flow rate ratio Ar:NO:He=27:18:55), thereby forming a CrON layer having a thickness of 16 nm. Finally, reactive sputtering (DC sputtering) was carried out by setting the power of a DC power supply to 1.7 kW in a mixed gas atmosphere of argon (Ar), carbon dioxide ($CO_2$), nitrogen ($N_2$), and helium (He) (gas pressure 0.2 Pa, gas flow rate ratio Ar:$CO_2$:$N_2$:He=20:35:5:30), thereby forming a CrOCN layer having a thickness of 14 nm. In this manner, a chromium-based light-shielding film of a three-layer laminated structure having a total thickness of 69 nm was formed.

This light-shielding film was adjusted so that the optical density (OD) was 3.0 at the wavelength 193 nm of ArF excimer laser exposure light.

In the manner described above, a binary mask blank having the pattern-forming thin film in the form of the light-shielding film on the glass substrate was manufactured.

Then, a binary mask was manufactured using the above-mentioned binary mask blank.

First, a chemically amplified negative resist film for electron beam writing (manufactured by FUJIFILM Electronic Materials Co., Ltd.: SLV08) was formed as a resist film on the mask blank. The resist film was formed by spin coating using a spinner (spin coating apparatus). After the resist film was coated, a predetermined heating drying treatment was carried out. The thickness of the resist film was set to 200 nm.

Then, using an electron beam writing apparatus, a required pattern was written on the resist film formed on the mask blank and, thereafter, the resist film was developed with a predetermined developer, thereby forming a resist pattern. Then, using the resist pattern as a mask, the light-shielding film was etched. A mixed gas of $Cl_2$ and $O_2$ was used as a dry etching gas.

Then, the remaining resist pattern was stripped, thereby obtaining a binary mask. There was almost no change in the optical density or the front-surface reflectance of the light-shielding film compared to those at the time of the manufacture of the mask blank.

With respect to the binary mask thus obtained, a highly concentrated ozone gas (100 vol %) and an ethylene gas were supplied and mixed together near a surface of a light-shielding film pattern, thereby carrying out a treatment of causing the highly concentrated ozone gas and the ethylene gas to act on the surface of the light-shielding film pattern. In this event, the flow rate ratio of the ozone gas to the ethylene gas was set to 2:1. The treatment time (time for causing the ozone gas and the ethylene gas to act) was set to 10 minutes and the substrate was heated to 60° C.

A section of the light-shielding film pattern of the manufactured binary mask was observed in detail using TEM (transmission electron microscope). As a result, a coating film (surface modified layer) with a thickness of about 1 nm was uniformly formed at a surface layer portion and side walls of the light-shielding film pattern. This surface modified layer was substantially the same as the surface modified layer which was formed at the surface of the light-shielding film in the above-mentioned mask blank when the highly concentrated ozone gas treatment was carried out for 10 minutes.

The optical density of the light-shielding film pattern after the treatment was 3.0 and thus there was no change from that before the treatment. The front-surface reflectance at the wavelength 193 nm of exposure light was also confirmed. As a result, almost no change was observed from that before the treatment. Further, there was no change in the CD of the light-shielding film pattern after the treatment compared to that before the treatment.

Accordingly, it was confirmed that the surface modified layer was formed without changing (degrading) the optical properties or the CD of the light-shielding film pattern before and after the highly concentrated ozone gas treatment.

The manufactured binary mask of this Example was subjected to ozone cleaning under the same conditions as in Example 1 and then the optical density of the light-shielding film pattern was measured. As a result, it was 3.0 and thus there was almost no decrease in optical density. Further, the light-shielding film pattern was confirmed by cross-sectional TEM. As a result, the change in CD was suppressed to be very small. The front-surface reflectance at the wavelength 193 nm of exposure light was also confirmed. As a result, almost no change was observed from that before the ozone water cleaning. That is, it was confirmed that the binary mask of this Example had extremely high ozone cleaning resistance.

Comparative Example 2

A phase shift mask was manufactured in the same manner as in Example 5 except that, in Example 5, with respect to the phase shift mask in which the light-semitransmissive film pattern and the light-shielding film pattern were laminated on the glass substrate, the treatment of causing the highly concentrated ozone gas and the ethylene gas to act on the surface of the thin film pattern was omitted.

A section of the thin film pattern of the manufactured phase shift mask of this Comparative Example was observed in detail using TEM (transmission electron microscope). As a result, no surface modified layer was formed at a surface layer portion or a side wall of the light-shielding film pattern. The optical density of the laminated film comprising the light-semitransmissive film pattern and the light-shielding film pattern was 3.0

The manufactured phase shift mask of this Comparative Example was subjected to ozone cleaning under the same conditions as in Example 5 and then the optical density of the laminated film was measured. As a result, it was 2.8 and thus was significantly decreased. From this, it was seen that the ozone cleaning resistance of the phase shift mask of this Comparative Example was low.

Example 9

A halftone phase shift mask having a light-shielding band was manufactured in the same manner as in Example 5. This halftone phase shift mask was subjected to ozone cleaning under the same conditions as in Example 5. Using this prepared halftone phase shift mask, a process was carried out to expose and transfer a transfer pattern onto a resist film on a semiconductor wafer as a transfer target. An exposure apparatus used was of the immersion type with annular illumination (Annular Illumination) using an ArF excimer laser as a light source. Specifically, by setting the halftone phase shift mask on a mask stage of the exposure apparatus, a transfer pattern was exposed and transferred onto a resist film for ArF immersion exposure on a semiconductor wafer. Then, the exposed resist film was subjected to predetermined development, thereby forming a resist pattern.

Further, using the resist pattern, a circuit pattern including a DRAM half-pitch (hp) 32 nm line & space (L&S) pattern was formed on the semiconductor wafer.

The obtained circuit pattern on the semiconductor wafer was observed by an electron microscope (TEM). As a result, the specification of the DRAM half-pitch (hp) 32 nm L&S pattern was fully satisfied. That is, it was confirmed that this halftone phase shift mask was fully able to transfer a circuit pattern including a DRAM half-pitch (hp) 32 nm L&S pattern onto a semiconductor wafer.

Description of Symbols 1 transparent substrate
2 thin film
3 resist film
10 mask blank
20 transfer mask
21 antireflection layer

The invention claimed is:

1. A method of manufacturing a mask blank having, on a substrate, a thin film which is formed at its surface with an antireflection layer made of a material containing a transition metal, comprising:
    after forming the thin film having the antireflection layer, carrying out a treatment of causing a highly concentrated ozone gas with a concentration of 50 to 100 vol % and an unsaturated hydrocarbon gas to act on the antireflection layer to thereby form a surface modified layer comprising a strong oxide film containing an oxide of the transition metal at a surface of the antireflection layer.

2. The method of manufacturing a mask blank according to claim 1, wherein the unsaturated hydrocarbon is a low-grade unsaturated hydrocarbon having a carbon number of 1 to 4.

3. The method of manufacturing a mask blank according to claim 1, wherein the treatment is carried out while heating the substrate with the thin film at 80° C. or less.

4. The method of manufacturing a mask blank according to claim 1, wherein a property of the mask blank is maintained before and after the treatment and the property is at least one of a flatness of the mask blank, a surface roughness of the thin film, an optical property of the thin film, and an in-plane uniformity of the optical property of the thin film.

5. The method of manufacturing a mask blank according to claim 1, wherein an amount of change in flatness of the mask blank is 30 nm or less before and after the treatment.

6. The method of manufacturing a mask blank according to claim 1, wherein the surface modified layer has a surface roughness (Ra) of 0.70 nm or less.

7. The method of manufacturing a mask blank according to claim 1, wherein the transition metal is chromium (Cr) or tantalum (Ta).

8. A method of manufacturing a transfer mask having, on a substrate, a thin film pattern formed by patterning a thin film comprising a material containing a transition metal, comprising:
    after forming the thin film pattern, carrying out a treatment of causing a highly concentrated ozone gas with a concentration of 50 to 100 vol % and an unsaturated hydrocarbon gas to act on the thin film pattern to thereby form a surface modified layer comprising a strong oxide film containing an oxide of the transition metal in a surface layer of the thin film pattern.

9. The method of manufacturing a transfer mask according to claim 8, wherein the unsaturated hydrocarbon is a low-grade unsaturated hydrocarbon having a carbon number of 1 to 4.

10. The method of manufacturing a transfer mask according to claim 8, wherein the treatment is carried out while heating the substrate with the thin film pattern at 80° C. or less.

11. The method of manufacturing a transfer mask according to claim 8, wherein a property of the transfer mask is maintained before and after the treatment and the property includes any one of an optical density, a surface reflectance at an exposure wavelength, a surface reflectance at an inspection wavelength, and a CD of the thin film pattern.

12. The method of manufacturing a transfer mask according to claim 8, wherein the surface modified layer has a thickness of 3 nm or less.

13. The method of manufacturing a transfer mask according to claim 8, wherein the transition metal is chromium (Cr) and the oxide of the surface modified layer contains a trivalent or tetravalent chromium oxide.

14. The method of manufacturing a transfer mask according to claim 8, wherein the transition metal is tantalum (Ta).

15. A method of manufacturing a semiconductor device, comprising:
    forming a transfer mask according to claim 8 and forming a circuit pattern on a semiconductor wafer using the transfer mask.

16. A method of manufacturing a semiconductor device, comprising:
    forming a mask blank comprising (a) a substrate, (b) a thin film formed on the substrate, and an antireflection layer formed on a surface of the thin film and made of a material containing a transition metal, wherein the antireflection layer has a surface modified layer comprising a strong oxide film containing an oxide of the transition metal;
    forming a transfer mask according to claim 8 and by patterning the thin film in the mask blank to form a thin film pattern; and
    forming a circuit pattern on a semiconductor wafer using the transfer mask.

* * * * *